United States Patent [19]
Olson

[11] Patent Number: 5,418,064
[45] Date of Patent: May 23, 1995

[54] ELECTROLESS PLATING OF SUBSTRATES

[75] Inventor: Larry D. Olson, Viroqua, Wis.

[73] Assignee: Allied Signal Inc., Morris Township, Morris County, N.J.

[21] Appl. No.: 168,005

[22] Filed: Dec. 15, 1993

Related U.S. Application Data

[63] Continuation-in-part of Ser. No. 976,866, Nov. 16, 1992, Pat. No. 5,292,557.

[51] Int. Cl.$^6$ .................. B32B 15/08; B32B 27/38
[52] U.S. Cl. .................. 428/418; 427/306; 427/437; 427/443.1; 428/458; 428/460
[58] Field of Search .............. 427/364, 305, 437, 438, 427/443.1, 306; 428/418, 458, 460

[56] References Cited

U.S. PATENT DOCUMENTS

| | | | |
|---|---|---|---|
| 3,011,920 | 12/1961 | Shipley | 106/1.11 |
| 3,682,671 | 8/1972 | Zeblisky | 106/286 |
| 5,043,253 | 8/1991 | Ishikawa | 430/393 |
| 5,292,557 | 3/1994 | Olson | 427/443.1 |

Primary Examiner—Michael Lusignan
Attorney, Agent, or Firm—Harold N. Wells; Roger H. Criss

[57] ABSTRACT

Electroless deposition of copper from solution onto a substrate, particularly a polymeric laminate for use in electronic circuitry, is accomplished by first treating said substrate with a stilbene-based fluorescent brightener to sensitize said substrate and thereafter contacting said substrate first with a solution of a catalytic metal and then with an electroless copper plating solution.

11 Claims, No Drawings

ELECTROLESS PLATING OF SUBSTRATES

CROSS-REFERENCE TO RELATED APPLICATIONS

This is a continuation-in-part of Ser. No. 07/976,866 filed Nov. 16, 1992 U.S. Pat. No. 5,292,557.

BACKGROUND OF THE INVENTION

The invention is related to the deposition of metals on substrates, particularly reinforced polymer laminates of the type used in electronic circuitry.

Electronic circuits are typically formed on reinforced polymer laminates by depositing metals, usually copper, on the surface. The circuit patterns may be made by placing a thin layer of copper foil on the surface of the laminate and then removing portions of the copper to leave the desired pattern. Another method is to deposit the copper from a solution, either as a continuous layer which is treated as just described or preferably, only on areas which form the pattern. Electroplating is not feasible because the laminates are not electrical conductors, hence the method called "electroless plating" has been developed. Solutions of copper salts are prepared and brought into contact with the substrate. In order to deposit the metal from solution it has heretofore been common practice to sensitize the surface of the substrate with a metal which is catalytic to the deposition of copper. Many metals have been suggested to have such capability, but in practice the most commonly used sensitizer has been the combination of palladium and tin salts in an acid solution. An early patent is U.S. Pat. No. 3,011,920 which describes a colloidal solution of such metals. An optically clear, non-colloidal solution is the subject of U.S. Pat. No. 3,682,671.

While metals are currently being used to catalyze the deposition of copper from solution, it will be evident that the use of a separate sensitizing solution involves additional steps and extra costs associated with the metals, particularly the expensive palladium. If it were possible to sensitize the surface of the substrate with less expensive materials, especially by incorporating such materials into the substrate, significant advantages would be obtained in the manufacture of electronic circuits on polymeric laminates and in other applications where electroless deposition of copper is used.

SUMMARY OF THE INVENTION

An improved method of electroless deposition employs a stilbene-based fluorescent brightener to sensitize the surface of a substrate. Electroless deposition of copper from solutions can be accomplished without using catalytic metals such as palladium. Furthermore, when such brighteners are used with conventional electroless plating processes where palladium is used, it has been found that the rate of copper deposition is increased and the effect of changes in plating bath composition is reduced.

In one aspect the invention is a reinforced polymer laminate, particularly a glass-reinforced epoxy laminate, which contains a stilbene-based fluorescent brightener. The brightener may be added to the polymer when the laminate is formed or may be applied to the surface later, either uniformly or in the pattern of the electronic circuitry.

A preferred fluorescent brightener has the CAS number 27344-06-5, which has the formula:

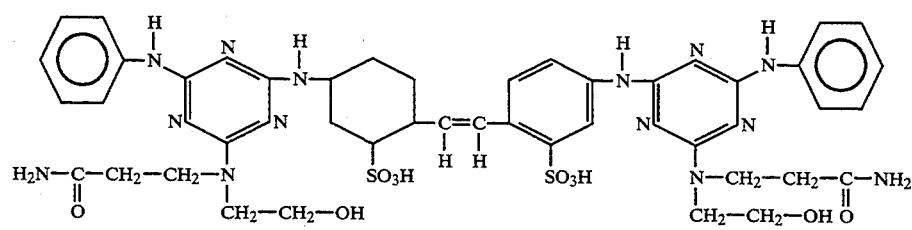

DESCRIPTION OF THE PREFERRED EMBODIMENTS

Electroless Plating

As previously discussed, it is common practice to deposit layers of copper by electroless plating onto reinforced polymer laminates during the fabrication of multi-layer circuit boards. Electroless plating also finds other applications and the invention is not necessarily confined only to electronic circuit applications.

The electroless plating process usually involves two principal steps, namely, applying a metal (or metals) catalytic to the deposition of copper (or other metal such as nickel in other applications) and then contacting the sensitized substrate containing the catalytic metal with another solution to plate copper on the substrate.

Various metals have been suggested to be catalytic to the deposition of metals such as nickel, cobalt, chromium, and copper from solution. For copper deposition, U.S. Pat. No. 3,011,920 suggests Cu, Pb, Pt, Rh, Ru, Os, Ir, Fe, Co, C, He, Ni, Al, Au, Pd, and Me, although Au, Pt, and Pd were preferred. Pd and Sn in an acid solution are believed to be still in commercial use. Clearly, the use of a separate processing step which consumes expensive metals and which is essential to the successful deposition of copper is not desirable. If less expensive sensitizing materials could be found and if they could avoid the need for or simplify the separate process step now required, the art would be significantly advanced.

The copper solutions are formulated to provide compositions which are unstable in the presence of the sensitizing agents (e.g. Pd and Sn) and result in the reduction of the copper (or other metal) ions to the metallic state so that they are precipitated on the surface where the sensitizing agents are located. Typical metal solutions are given in the examples of U.S. Pat. No. 3,011,920. In the present invention, similar solutions may be used or others familiar to those skilled in the art, provided that precipitation of metal from solution with the sensitizing agents of the invention occurs. Typically, a copper (or other metal) solution would be prepared and brought into contact with a substrate containing or coated with a sensitizing agent of the invention for a period of time sufficient to deposit the desired thickness of metal. Alternatively, the substrate of the invention can be contacted with conventional sensitizing agents such as Pd and Sn before being introduced into the copper solution.

Sensitizing Agents

The sensitizing agents of the invention are found in the family of stilbene-based fluorescent brighteners. These materials absorb ultraviolet light and emit visible light and are used for various purposes, such as in textiles and as additives in inks and coatings. They may be included in epoxy or other polymer laminates to prevent ultraviolet light from penetrating the laminate and interfering with the use of photoresists on the surface.

Typical members of this family of fluorescent brighteners are prepared from amino compounds of 2,2'-stilbene disulfonic acid. Many, including the preferred fluorescent brightener, react 4,4'-diamino-2-2'-stilbene sulfonic acid with cyanuric chloride and then further react the product. In particular, the preferred fluorescent brightener has the GAS No. 27344-06-5, which has the following formula:

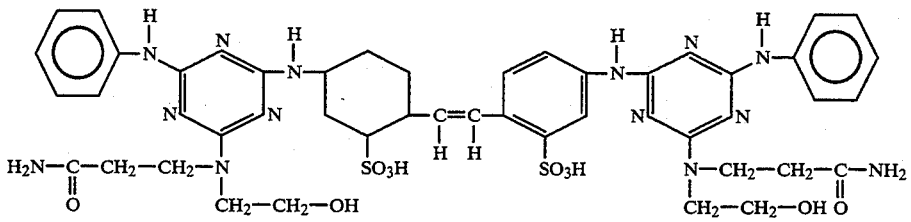

Substrates

The invention has potential uses in any substrates which are now or could be plated by the electroless plating process. In particular, plastic articles and most particularly, reinforced polymer laminates are plated to provide conductive circuit paths on their surface. While epoxy laminates are most common, the invention Could be applied to such polymers as polyimides, cyanate esters, bismaleimide-triazines, phenolics, as the like. In laminates, reinforcement is typically provided by woven and non-woven glass fibers (e.g. E-glass, S-glass), polyamides (e.g. Kevlar ®), paper, quartz, and the like.

The concentration of the sensitizer at the surface of the laminate should be in an amount effective to sensitize the electroless plating. For polymer laminates which incorporate the fluorescent brightener into the polymer mixture used as the matrix for the laminate, this is about 0.001 to 10 wt. %, preferably 0.1 to 2 wt. % based on the polymer. Alternatively, where no other purpose is to be accomplished by the fluorescent brightener, it may be applied to the surface of the substrate in a suitable composition and in amount adequate to sensitize the surface for electroless plating. It will be clear that one advantage of the later procedure is that the sensitizer could be applied with a mask defining the circuit pattern to be obtained. Thereafter, contact with the copper solution would directly deposit the metal in the desired pattern.

Example 1

A mixture suitable for coating glass fabric was prepared by combining an epoxy resin (Dow Chemical 71881) with 0.125 wt. % of Leuchophor BSB (CAS 27344-06-5 Sandoz Chemical Co.), 2.8 wt. % dicyandiamide, and 0.044 wt. % 2-methyl imidazole (all based on epoxy resin solids) and solvent (53 wt. % based on epoxy resin of DMF and acetone, weight ratio 0.77/1). A glass reinforcing fabric (7628 fabric-CS718 finish Clark-Schwebel) was coated with 43% by weight of the mixture. The coated fabric was then cured by heating to 175° C. under a pressure of 900 psig (6205 kPa gauge) and holding for 65 minutes.

Example 2

The epoxy laminate of Example 1 was placed in an electroless plating bath containing a soluble copper compound. It was found that the copper plated onto the laminate and it was concluded that the fluorescent brightener was functioning as a catalyst for the deposition of copper.

Example 3

An epoxy laminate was prepared in a similar manner to that of Example 1. An epoxy resin (Dow Chemical 71881) was combined with 0.125 wt. % of Leuchophor BSB, 2.8 wt. % dicyandiamide, and 0.044 wt. % 2-methyl imidazole (all based on epoxy resin solids) and solvent (38 wt. % based on epoxy resin of DMF and acetone, weight ratio of 0.77/1). A glass reinforcing fabric (7628 fabric CS718 finish Clark-Schwebel) was coated with 44±2 wt. % of the epoxy resin mixture. The coated fabric was cured by heating to 175° C. under a pressure of 900 psig (6205 kPa gauge) and holding for 65 minutes.

Example 4

The cured epoxy laminate of Example 3 was tested in a laboratory simulation of a commercial electroless copper deposition process. In this process the laminate was dipped into a bath containing a palladium catalyst before being introduced into the copper solution. When compared with a conventional FR-4 epoxy laminate the laminate containing the fluorescent brightener was found to deposit copper at a rate about 25–30% higher and required less adjustment to the solution composition as a series of tests were carried out. It was concluded that the use of a fluorescent brightener had advantages where palladium catalysts were used as sensitizing agents and thus could provide benefits when conventional electroless plating processes were employed.

I claim:

1. A method for electroless deposition of copper from solution onto a substrate comprising treating said substrate with an effective amount of a stilbene-based fluorescent brightener to sensitize said substrate and thereafter first contacting said substrate with a solution of a catalytic metal and then with an electroless copper plating solution.

2. The method of claim 1 wherein said fluorescent brightener has the formula

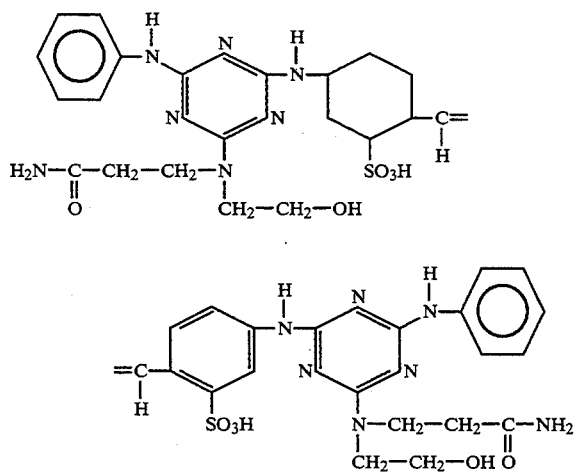

3. The method of claim 1 wherein said fluorescent brightener is incorporated into the substrate.

4. The method of claim 1 wherein said fluorescent brightener is placed on the surface of the substrate.

5. The method of claim 1 wherein said substrate is a reinforced polymer laminate.

6. The method of claim 5 wherein said polymer is selected from the group consisting of epoxy, polyimide, cyanate ester, bismaleimide-thiazine, and phenolic.

7. The method of claim 6 wherein said polymer is epoxy.

8. The method of claim 5 wherein said laminate is reinforced with a member of the group consisting of woven and non woven glass, polyamide, paper, and quartz.

9. The method of claim 1 wherein the substrate is a polymer laminate and the concentration of said brightener is about 0.001 to 10 wt. % based on the polymer.

10. The method of claim 9 wherein said brightener concentration is about 0.1 to 2 wt. %.

11. An electroless plated substrate produced by the method of claim 1.

* * * * *